United States Patent [19]
Mizutani et al.

[11] 4,352,974
[45] Oct. 5, 1982

[54] PLASMA ETCHER HAVING ISOTROPIC SUBCHAMBER WITH GAS OUTLET FOR PRODUCING UNIFORM ETCHING

[75] Inventors: Tatsumi Mizutani, Kokubunji; Norio Kanai, Kodaira; Kunio Harada, Hachioji; Hideo Komatsu, Hinodemachi; Shinya Iida, Tama, all of Japan

[73] Assignee: Hitachi, Ltd., Tokyo, Japan

[21] Appl. No.: 173,364

[22] Filed: Jul. 29, 1980

[30] Foreign Application Priority Data

Aug. 1, 1979 [JP] Japan .................................. 54-97280

[51] Int. Cl.³ ............................ B23K 9/00; C23F 1/02
[52] U.S. Cl. ........................ 219/121 PD; 219/121 PF; 219/121 PG; 219/121 PQ; 156/646; 156/643; 250/531; 250/539; 204/192 E; 204/164
[58] Field of Search ................. 219/121 PG, 121 PD, 219/121 PF, 121 PQ; 204/192 E, 298, 164; 156/643, 646, 345; 250/530, 531, 535, 539

[56] References Cited

U.S. PATENT DOCUMENTS

| Re. 30,244 | 4/1980 | Alexander, Jr. et al. | 156/643 |
| 3,875,068 | 4/1975 | Mitzel | 204/192 E |
| 4,153,528 | 5/1979 | Dykerman et al. | 204/298 |
| 4,209,357 | 6/1980 | Gorin et al. | 204/192 E |
| 4,230,515 | 10/1980 | Zajac | 156/643 |

FOREIGN PATENT DOCUMENTS 2397067  3/1979  France .............................. 156/646

Primary Examiner—M. H. Paschall
Attorney, Agent, or Firm—Antonelli, Terry & Wands

[57] ABSTRACT

A plasma etcher wherein the provision of a gas outlet directly in an etching chamber is avoided and wherein a subchamber having a sufficient capacity is connected to the etching chamber through a joint part, the gas outlet being provided in this subchamber. With the apparatus, the distribution of etching rates in plasma etching becomes uniform.

23 Claims, 5 Drawing Figures

PLASMA ETCHER HAVING ISOTROPIC SUBCHAMBER WITH GAS OUTLET FOR PRODUCING UNIFORM ETCHING

BACKGROUND OF THE INVENTION

1. Field of the Invention

This invention relates to improvements in a plasma etcher which utilizes a glow discharge plasma.

2. Brief Description of the Prior Art

In recent years, in order to cope with high densities of packaging of semiconductor integrated circuits, the development of the fine pattern delineation technology exploiting a radio frequency glow discharge has been vigorously promoted. This method is such that a low pressure gas containing a hologen is introduced into a vacuum chamber, an r.f. field is applied to convert the low pressure gas into a plasma, and the surface of a sample is etched and worked by active ions or radicals in the generated plasma. This method is generally referred to as a "dry etching process."

As compared with the conventional wet etching process employing a liquid, this method has the advantage that a fine pattern can be delineated with high precision; whereas, it has the disadvantage that the uniformity of etching is often insufficient. The causes for the non-uniform etching relate to various factors, such as non-uniformity in the r.f. field, non-uniformity in the stream of gas and non-uniformity in the concentrations of etching reaction products.

The inventors have found out that, in the case where an outlet for the gas is connected directly with the etching chamber, as in the prior art plasma etcher, the stream of gas towards the outlet becomes non-uniform, so the distribution of etching rates becomes particularly non-uniform.

A schematic view for explaining an example of the prior art apparatus in which the outlet is connected directly with the etching chamber in this manner is shown in FIG. 1. The apparatus illustrated in FIG. 1 is the so-called parallel plate diode type plasma etcher which includes two plate electrodes 1 and 2 within an etching chamber 6. The electrode 2, for example, is supplied with r.f. power from an r.f. power source 5, to generate a plasma within the etching chamber 6. A gas to be turned into the plasma is introduced through a gas inlet 3 provided in one of the sidewalls of the etching chamber, and it is discharged through a gas outlet 4 provided in the other sidewall.

Using the prior art apparatus, the inventors investigated the distribution of etching rates on the electrode 2 in the case where an Al specimen arranged on the electrode 2 and having a diameter of 35 cm was etched by introducing $BCl_3$ gas into the etching chamber 6 at a flow rate of 50 ml/min. to set the pressure within the etching chamber 6 at 0.15 Torr and then applying r.f. power to generate a plasma. As a result, it has been revealed that the etching rates of Al are non-uniform on the electrode and that they are conspicuously non-uniform especially in the vicinity of the gas outlet. The non-uniformity amounted to ±10% or so. It is added that this finding has not been published yet.

The following references are cited to show the state of the art:

(i) Japanese Published Unexamined Patent Application No. 52-91745,
(ii) Japanese Published Unexamined Patent Application No. 52-132677, and
(iii) Japanese Published Unexamined Patent Application No. 54-11676.

SUMMARY OF THE INVENTION

This invention has for its object to provide a plasma etcher of novel structure which eliminates the difficulty in the prior art described above.

In order to accomplish this object, in the etcher of the present invention, provision of a gas outlet directly in the etching chamber is avoided by connecting a subchamber having a sufficient capacity to the etching chamber in an isotropical shape and arrangement, and by providing the gas outlet in this subchamber.

More specifically, the plasma etcher according to this invention is an etcher for etching surfaces of workpieces with a gaseous discharge plasma generated within an etching chamber provided with a plurality of electrodes, and comprising (i) a gas inlet which serves to introduce a gas into said etching chamber, (ii) a joint part which is isotropically disposed outside an outer fringe of the electrode for arranging said workpieces thereon and through which said gas can flow, (iii) an isotropically-designed subchamber which is coupled with said etching chamber through said joint part and which has a sufficient capacity as well as a conductance greater than that of said joint part, and (iv) a gas outlet which is provided in said subchamber.

Any apparatus for performing etching with a plasma may be formed in accordance with the above-mentioned construction, and the etcher need not be restricted to any specified type. In general, an ordinary parallel plate diode type apparatus may be employed.

In order to improve the uniformity of the stream of the gas still more, the gas inlet is preferably provided substantially centrally of the top or bottom of the etching chamber, and especially, it is preferably provided substantially centrally of the wall opposite to the electrode on which the workpieces are arranged. In the case where the gas inlet is provided in a manner to pass substantially the center of the top or bottom of the etching chamber and to penetrate substantially the center of one of the electrodes, a gas stream of still better uniformity can be expected, and hence, this construction can be said to be more desirable. However, even when the gas inlet is arranged anisotropically as in the prior art, the plasma etcher according to this invention is constructed so as to emit the gas via the isotropically-designed subchamber, so that the uniformity of the etching rate distribution of the workpieces is improved and the effect of this invention is achieved.

The joint part and the subchamber need to be isotropic. This signifies that, when viewed from the center axis of the etching chamber, they exist continuously or at equiangular intervals without having their distances from the center axis varied in dependence on direction. Also, their configuration shall not differ depending on direction when viewed from the center axis.

In order to make the stream of the gas isotropic, the subchamber must have a sufficient size. It is desirable that the ratio between the capacity of the subchamber and the capacity of the etching chamber is at least 0.2, and it is more preferable that the ratio is at least 0.3. In the case where this ratio falls short of 0.2, the non-uniformity of the etching rates becomes conspicuous, and unfavorably, the degree of non-uniformity reaches approximately ±7%. In theory, there is no upper limit to the size of the subchamber; however, when the subchamber is made very large, the cost of the apparatus rises while the beneficial effects derived therefrom reach a limit. It is therefore advisable to confine the ratio to about 1 (one), that is, to allow the size of the subchamber to be no greater than that of the etching chamber.

The gas passes from the etching chamber via the joint part into the subchamber and then goes into the gas outlet. Therefore, unless the conductance of the subchamber, that is, the inverse value of flow resistance against gas flow, is greater than the conductance of the joint part, the unfavorable influence of the gas outlet on the stream of gas within the etching chamber remains. The conductance of the subchamber is accordingly made higher than that of the joint part. As a rough aim, it is sufficient that the sectional area of the part of the subchamber proximate to the joint part and facing it is at least 3 times, preferably at least 5 times, as large as the sectional area of the joint part. The shape of the subchamber may be isotropic when viewed from the center axis of the etching chamber, but an excessively-flat shape is unfavorable. A subchamber having a flat shape is bulky in attaining an identical capacity, and moreover, the flow resistance increases. When the subchamber is shaped so that the width in the radial direction and the height may become approximately equal, there is no special problem. It is also permissible that one dimension is approximately 5 times greater than the other at the maximum.

In the plasma etcher according to this invention constructed as described above, the gas flows out substantially isotropically from the fringe of the electrode on which the workpieces are arranged. In the case of employing the prior art apparatus having the structure as shown in FIG. 1, the gas pressure is low in the vicinity of the gas outlet, and hence, the gas within the etching chamber flows non-uniformly towards this outlet. In contrast, in the apparatus of the present invention, constructed as described above, the occurrence of such nonuniform flow of the gas can be prevented. Accordingly, the object of providing the subchamber is to restrain the gas pressure from becoming lower in the vicinity of the gas outlet than in the other part of the etching chamber and to provide for an isotropic emission of the gas from the etching chamber.

DESCRIPTION OF THE PREFERRED EMBODIMENTS

Embodiment 1

Figure 2:
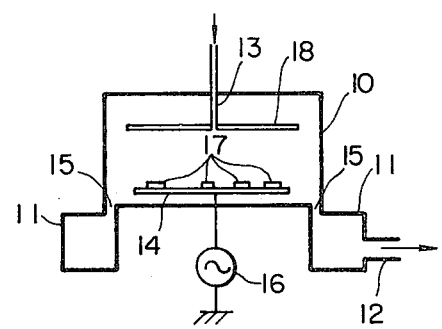
FIGS. 2, 3 and 5 are all schematic views of plasma etchers according to various embodiments of this invention.

As illustrated in FIG. 2, in a parallel plate diode type plasma etcher, which contains two disc electrodes 14 and 18 within an etching chamber 10, an annular subchamber 11 is disposed at the lower end part of the cylindrical etching chamber 10, and further, a gas outlet 12 leading to a vacuum pump is connected to a side part of the subchamber 11. The capacity of the etching chamber 10 was made 30 lit., and the capacity ratio of the subchamber 11 to the etching chamber 10 was made 0.3. A gas supplied from a gas inlet 13 provided in an upper part of the etching chamber 10 flows radially outward and isotropically over the electrode 14, into the subchamber 11 via a narrow ring-shaped gap (joint part) 15 around the electrode 14, and thereafter towards the gas outlet 12. The width of the gap 15 was about 1.5 cm and the height about 5 cm, and both the width and the height of the subchamber 11 were about 8 cm.

Figure 1:
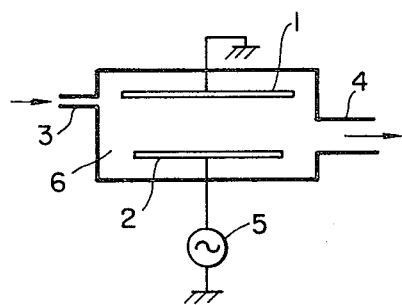
FIG. 1 is a schematic diagram of a prior art plasma etcher.

Si specimens 17 with Al evaporated on their surfaces were arranged on the electrode 14 of the etcher having the above construction, and the etching chamber was evacuated to vacuum. Thereafter, $BCl_3$ gas was introduced from the gas inlet at a flow rate of 50 ml/min., as calculated under 1 atm., to hold the pressure inside the etching chamber at 0.15 Torr. Further, an r.f. power of 250 W at 13.56 MHz was supplied from an r.f. power source 16 to the electrode 14 so as to produce a plasma of the $BCl_3$ within the etching chamber. The etching of the Al was carried forward by the produced plasma. Etching rates at this time were very uniform over the entire area of the electrode and were 120 nm/min. $\pm 3\%$ or less. In the case of employing the prior art etcher of the structure shown in FIG. 1, the non-uniformity of the etching rates is approximately $\pm 10\%$ as stated previously. As compared with this value, it is apparent that the results provided by the present invention exhibit remarkably-improved uniformity in the etching process.

Embodiment 2

Figure 3:
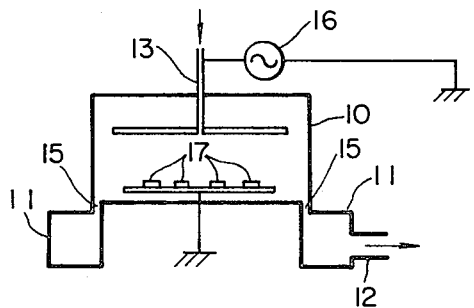

In an etcher which had the same configuration as that of the apparatus described in conjunction with Embodiment 1, the r.f. power was applied to the electrode opposite to that in FIG. 2, as illustrated in FIG. 3. Also in this case, quite the same effect as in Embodiment 1 could be obtained.

Embodiment 3

Figure 4:
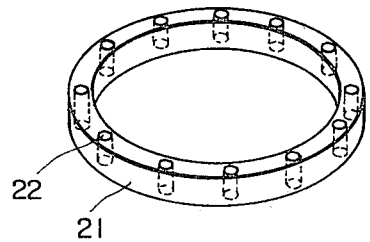
FIG. 4 is a perspective view of a joint part jig for use in an embodiment of this invention.

In the apparatus described in Embodiments 1 and 2, a joint part jig 21, as shown in FIG. 4, in which a large number of holes 22 of equal conductances are provided, was arranged in the gap 15 (as seen in FIGS. 2 and 3) extending from the etching chamber 10 to the subchamber 11. The width of the ring-shaped joint part jig 21 were made 1.5 cm, and the diameter of the holes 22 was made 1 cm. It is considered that the stream of the gas within the etching chamber can be made more isotropic by utilization of this jig. When the same experiment as performed in conjunction with Embodiment 1 was conducted with this apparatus, a good uniformity of etching could be realized as in Embodiment 1.

Embodiment 4

$CCl_4$ gas or $PCl_3$ gas was introduced into the etchers of Embodiments 1–3 at a flow rate of 10–50 ml/min., and the pressure inside the etching chamber was held at 0.05–0.1 Torr, under which conditions the gas was turned into a plasma. The etching of Si was carried out with this plasma, and as in the cases of the etching of Al in Embodiments 1–3, a good uniformity of etching was attained.

Embodiment 5

Figure 5:
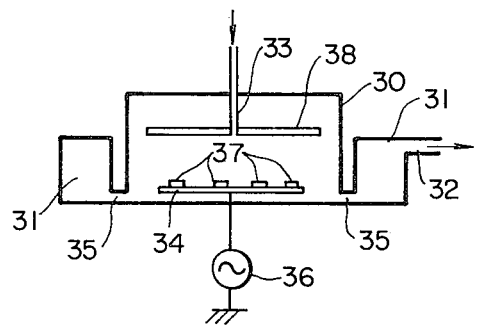

The same experiment as in Embodiment 1 was conducted by the use of the same apparatus as described in Embodiment 1 except that an annular subchamber 31 was disposed outside the side periphery of the lower part of a cylindrical etching chamber 30, as depicted in FIG. 5. Also, in this case, the uniformity of the etching of the workpieces was comparable to that in Embodiment 1.

In FIG. 5, numeral 32 designates a gas outlet, numeral 33 a gas inlet, numeral 34 a disc electrode with specimens 37 placed thereon, numeral 35 a joint part, numeral 36 an r.f. power source, and numeral 38 a disc electrode.

Obviously, many modifications and variations of the present invention are possible in light of the above teachings. It is therefore to be understood that within the scope of the appended claims, the invention may be practiced otherwise than as specifically described.

What is claimed is:

1. In an etcher for etching surfaces of articles with a gaseous discharge plasma generated within an etching chamber provided with a plurality of electrodes, a plasma etcher comprising
    (i) an etching chamber containing at least a pair of electrodes, one of said electrodes being arranged to support thereon articles to be etched;
    (ii) means defining a gas inlet which serves to introduce a gas directly into said etching chamber;
    (iii) means for effecting an isotropic emission of gas from said etching chamber including a joint part forming a restricted passage which is isotropically disposed outside an outer fringe of the electrode for supporting said articles and into and through which said gas can flow from said etching chamber;
    (iv) an isotropically-configured subchamber which is coupled with said etching chamber through said joint part and which has a capacity as well as a fluid conductance greater than that of said joint part, said subchamber having an annular configuration and said passage formed by said joint part being restricted to an extent necessary to restrain the gas pressure in said etching chamber in the vicinity of said passage from becoming substantially lower than the gas pressure in other parts of said etching chamber; and
    (v) means defining a gas outlet provided in said subchamber for accommodating the outflow of gas.

2. A plasma etcher as defined in claim 1, characterized in that said gas inlet is provided substantially centrally of a top or bottom wall of said etching chamber.

3. A plasma etcher as defined in claim 1, characterized in that said gas inlet is provided in a manner to pass through substantially the center of a top or bottom wall of said etching chamber and to penetrate substantially the center of one of said electrodes.

4. A plasma etcher as defined in claim 1, 2 or 3, characterized in that the ratio between the capacity of said subchamber and the capacity of said etching chamber is at least 0.2.

5. A plasma etcher as defined in claim 4, characterized in that the ratio between the capacity of said subchamber and the capacity of said etching chamber is at least 0.3.

6. A plasma etcher as defined in claim 4, characterized in that the ratio between the sectional area of the part of said subchamber facing said joint part and the sectional area of said joint part is at least 3.

7. A plasma etcher as defined in claim 4, characterized in that the ratio between the sectional area of the part of said subchamber facing said joint part and the sectional area of said joint part is at least 5.

8. A plasma etcher as defined in claim 6, characterized in that said etching chamber has a sidewall of cylindrical shape and said subchamber is isotropically connected to said etching chamber through said sidewall by way of said joint part.

9. A plasma etcher as defined in claim 8, characterized in that said subchamber has an annular configuration and surrounds said etching chamber.

10. A plasma etcher as defined in claim 1, characterized in that said joint part comprises a ring-shaped member having a plurality of holes therein providing communication between said etching chamber and said subchamber.

11. A plasma etcher as defined in claim 10, characterized in that said holes are uniformly spaced around said ring-shaped member.

12. A plasma etcher as defined in claim 1, further including means for connecting an r.f. power source to said electrode for supporting said articles.

13. A plasma etcher as defined in claim 1, further including means for connecting an r.f. power source to the electrode of said pair of electrodes other than the one supporting said articles.

14. A plasma etcher as defined in claim 1, wherein said etching chamber has an axis of symmetry and said gas inlet is disposed on said axis.

15. A plasma etcher as defined in claim 14, wherein said joint part and said subchamber are of annular configuration and are disposed symmetrically with respect to said etching chamber.

16. A plasma etcher as defined in claim 1, characterized in that said etching chamber has a sidewall of cylindrical shape and substantially flat endwalls and said subchamber is isotropically connected to said etching chamber through one of said endwalls by way of said joint part.

17. A plasma etcher as defined in claim 1, characterized in that said etching chamber has a sidewall of cylindrical shape and said subchamber is isotropically connected to said etching chamber through said sidewall by way of said joint part.

18. A plasma etcher as defined in claims 16 or 17, characterized in that the ratio between the sectional area of the part of said subchamber facing said joint part and the sectional area of said joint is at least 3.

19. A plasma etcher as defined in claims 16 or 17, characterized in that said joint part comprises a ring-shaped member having a plurality of holes therein providing communication between said etching chamber and said subchamber.

20. A plasma etcher as defined in claim 19, characterized in that said holes are uniformly spaced around said ring-shaped member.

21. A plasma etcher as defined in claims 16 or 17, characterized in that the ratio between the capacity of said subchamber and the capacity of said etching chamber is at least 0.3.

22. A plasma etcher as defined in claim 1, characterized in that the width of said subchamber in the radial direction and the height thereof are in a ratio no greater than five to one.

23. A plasma etcher as defined in claim 1, characterized in that the width of said subchamber in the radial direction is substantially equal to the height thereof.

* * * * *